United States Patent [19]

Igarashi

[11] Patent Number: 4,618,208
[45] Date of Patent: Oct. 21, 1986

[54] CIRCUIT TEST CLIP

[75] Inventor: Osamu Igarashi, Yokohama, Japan

[73] Assignee: Nikko Kogyo Kabushiki Kaisha, Tokyo, Japan

[21] Appl. No.: 791,762

[22] Filed: Oct. 28, 1985

[30] Foreign Application Priority Data

May 16, 1985 [JP] Japan ............................ 60-71568[U]

[51] Int. Cl.⁴ ............................................ H01R 11/22
[52] U.S. Cl. ............................ 339/200 P; 339/17 CF; 339/255 P
[58] Field of Search ........... 339/17 CF, 200 P, 255 P, 339/260, 261, 108 TP, 203

[56] References Cited

U.S. PATENT DOCUMENTS 3,506,949  4/1970  Venaleck et al. ................ 339/255 P
3,899,239  8/1975  Allard .............................. 339/255 P
3,914,007  10/1975 Seidler ............................. 339/255 P
4,012,097  3/1977  Long et al. ..................... 339/17 CF
4,116,518  9/1978  Pleskac .......................... 339/17 CF
4,210,383  7/1980  Davis ............................... 339/200 P

FOREIGN PATENT DOCUMENTS 1005227  3/1983  U.S.S.R. ......................... 339/200 P

Primary Examiner—E. Michael Combs
Attorney, Agent, or Firm—Martin Smolowitz

[57] ABSTRACT

A circuit test clip with a plurality of conducting elements making simultaneous electrical contact with an equal number of terminals on a miniaturized circuit formed on a printed circuit board. The test clip is useful for inspection or otherwise testing such miniaturized circuits.

6 Claims, 5 Drawing Figures

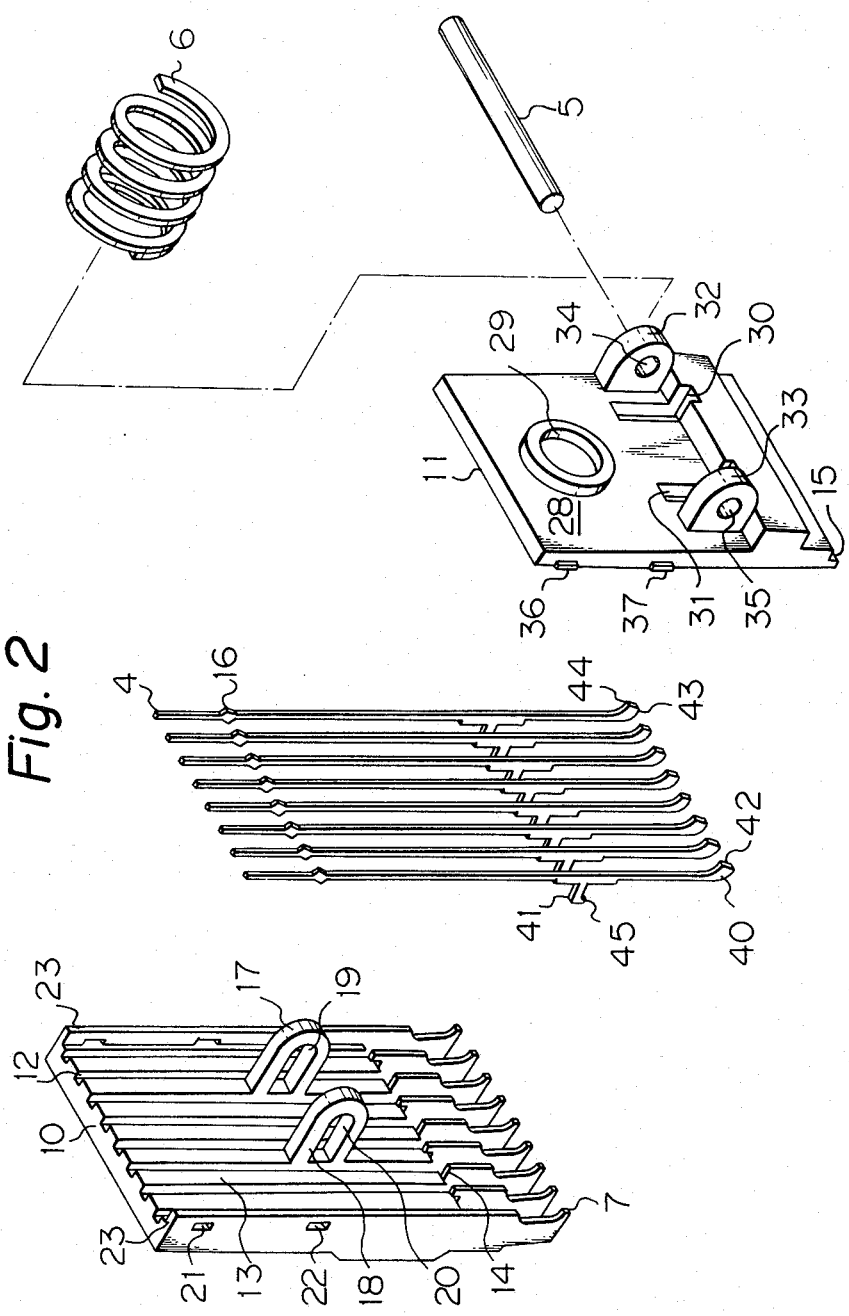

CIRCUIT TEST CLIP

BACKGROUND OF THE INVENTION

The present invention relates to a circuit test clip having a plurality of conducting elements that make simultaneous electrical contact with an equal number of terminals on a miniaturized circuit, such as an integrated circuit (IC), on a printed board for the purpose of inspection or otherwise testing such circuit.

Various types of IC circuit test clip have been proposed for use with ICs arranged at small spacings. The basic structure of these clips is shown in Japanese Utility Model Publication No. 41806/1974, Japanese Utility Model Public Disclosure No. 97952/1982 and U.S. Pat. No. 4,210,383: a pair of support members of the same shape are pivotally connected under spring pressure, and a plurality of electric conducting elements of the same length are embedded in each support member longitudinally at the same spacing so that the tip of each of the conductive elements is exposed from one support member and faces inwardly the corresponding tip of each of the conductive elements exposed from the other support member. The spacing between each conductive element is equal to that of IC pins or terminals, and after opening the exposed ends of the support members against the spring pressure, the tip of each conductive element is brought into contact with the corresponding bare IC pin. The other end of each conductive element extends from the rear end of each support member so that it can be electrically connected to a tester or other suitable measuring instruments.

The conductive elements are embedded in each of the support members and if one of them is broken, the clip must be entirely replaced. In order to avoid this inconvenience, a device has been proposed wherein multiple conductive elements are arranged at equal spacings and parallel to each other between inner and outer plates which are bonded with an adhesive to make a support member. However, even this clip involves great difficulty in replacing a single broken conductive element since the inner and outer plates which are strongly bonded to each other cannot be easily separated.

SUMMARY OF THE INVENTION

In order to solve the problems described above, the present inventon provides a circuit test clip comprising a pair of insulating support members that accommodate a plurality of electrically conducting elements of contactor type arranged at an interval corresponding to the arrangement of pins or terminals on an IC module to be tested and which are pivotally connected to each other about a single pin that intersects said support members at right angles which are provided with a spring that resiliently urges both of the front ends of the support members toward each other. The test clip of the present invention is further characterized by the following: each of the support members is an assembly of an outer plate superposed on an inner plate which is shorter in length than the outer plate; the outer plate has in the area confronting the inner plate a plurality of longitudinal slots juxtaposed at said interval for accommodating each of said conducting elements in each slot; said outer and inner plates respectively have first and second projections in the direction in which one support member faces the other support member, each of said projections having holes for insertion of said pin, the inner plate having through-holes for insertion of said first projections on said outer plate; the holes in said first projections being aligned with those in said second projections when the inner plate is superposed on the outer plate; and the positions of the first and second projections on one of said support members are complementary with those of the first and second projections on the other support member.

One object of the invention is to provide a circuit test clip having a pair of support members each of which is a superposed assembly of inner and outer plates which can rididly hold a plurality of electric conducting elements therein.

A second object of the invention is to provide a circuit test clip having a pair of support members each of which can be easily assembled and disassembled for replacement of said conducting elements.

A third object of the invention is to provide a circuit test clip that provides for electric access to the conducting element from the side face of the support member.

A fourth object of the invention is to provide a circuit test clip that permits easy and hence economical replacement of any one of the conductive elements accommodated in the clip.

BRIEF DESCRIPTION OF THE DRAWINGS

FIGS. 2 and 3 are exploded views of the same test clip, wherein FIG. 2 is as seen from one side of one support member including a spring and pin, and FIG. 3 is as seen from the same side of the other support member;

DETAILED DESCRIPTION OF THE PREFERRED EMBODIMENT

Figure 5:
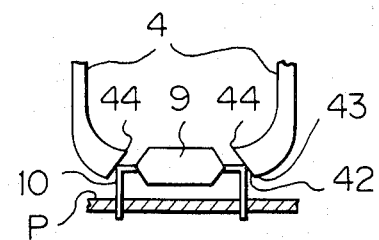
FIG. 5 is an elevational view of electric conductive elements in contact with IC pins.

Multiple electric conductor elements of contactor type are accmmodated in each of support members 2 and 3 which are pivotally connected around a pin 5 so that jaws 7 and 8 at the front ends of the support members loaded with a spring 6 are capable of gripping bare pins 10 on an IC module 9 as shown in FIG. 5. The two support members are substantially of identical shape, so the following description concerns only the support member 2.

Figure 1:
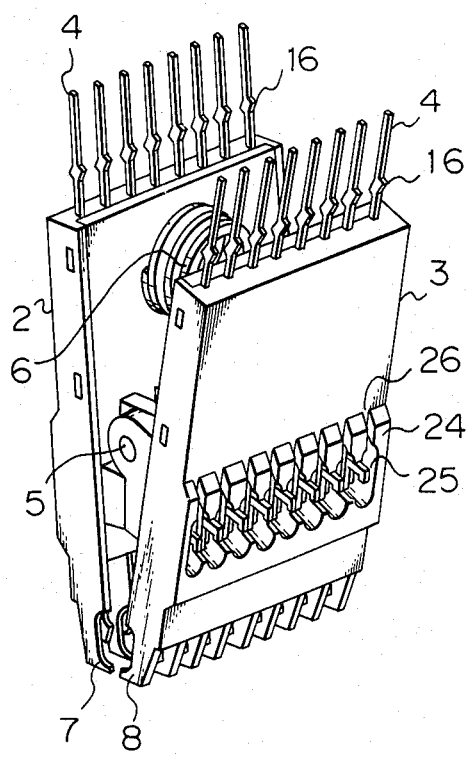
FIG. 1 is a perspective view of the circuit test clip of the present invention.
Figure 4:
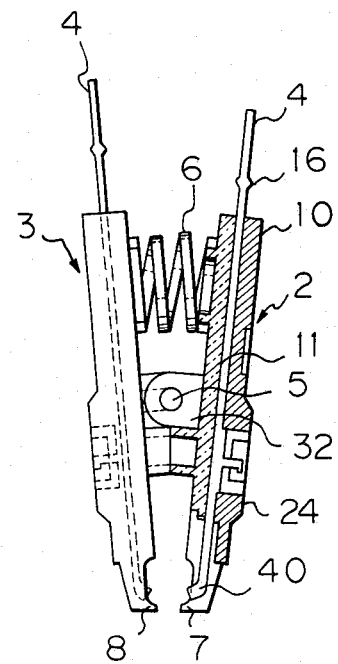
FIG. 4 is a side view of the clip with part taken away.
Figure 3:
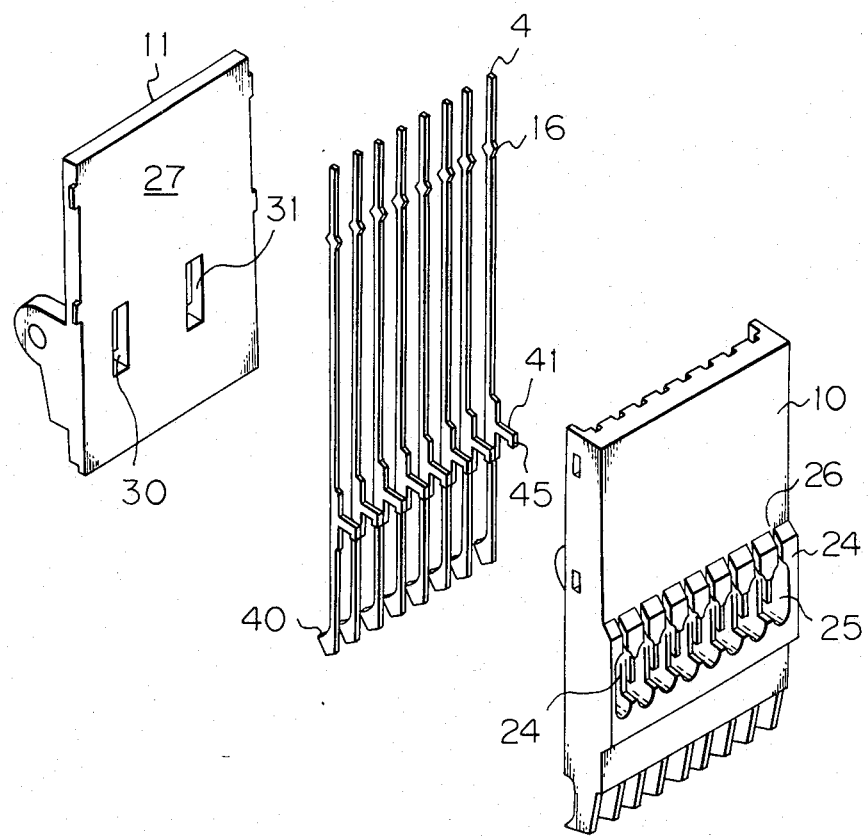

The support member 2 is composed of an insulating outer plate 10 and an insulating inner plate 11 that is smaller than the outer plate 10 in length and width. The surface of the outer plate 10 facing the inner plate 11 is provided with a plurality of slots 12 at spacings equal to the distance between adjacent IC pins. The flat ridge 13 between adjacent slots is provided with a step 14 close to the front end of the slot and one free end 15 of the inner plate rests on said step. The ridge 13 extends beyond the step and its tip is curved inwardly to form the jaw member 7. Two of the ridges 13 are provided with U-shaped first projections 17 and 18 with elongated openings 19 and 20 which are aligned on an axis intersecting the slots 12 at right angles. Through-holes 21 and 22 are made in a rim 23 that extends from the outer plate by a distance equal to the thickness of the inner plate, and these holes will make snap joint with bosses 36 and 37 formed on the inner plate. The outside of the outer plate is thicker between the step 14 and each of the first projections 17 and 18 than the other portions, and each of the slots 12 penetrate through the thicker portion 24 to form holes 25 that traverse the thicker portion 24 at right angles (FIGS. 1 and 3). The thicker portion 24 adjacent the holes 25 is provided with short slots 26 that run longitudinally parallel to each other and which communicate with the corresponding holes 25. The width of each slot 26 is slightly smaller than the outside diameter of a covered or coated lead wire so that the latter can be pressed into the slot 26.

The inner plate 11 has a length equal to the distance between the rear end of the outer plate and step 14, and has a width equal to the distance between a pair of rims 23; the side 27 of the inner plate that faces the outer plate is flat. The opposite side 28 of the inner plate 11 is provided with a spring seat 29 and has elongated holes 30 and 31 through which the first projections 17 and 18 are passed. On both sides of the elongated holes 30 and 31 are provided second projections 32 and 33 having holes 34 and 35 through which the pin 5 is to be inserted. The first projections 17 and 18, as well as the second projections 32 and 33 are formed in complementary positions between a pair of support members each being made of the combination of inner and outer plates. Bosses 36 and 37 are snap-jointed into the throughholes 21 and 22 in the outer plate.

Each of the electrically conductive elements 4 to be fitted into the slots 12 is an elongated member having a tip 40 which is curved like the blade of an ice hockey stick and having a hooked projection 41 in the middle that projects in a direction opposite the direction of the curvature. Each element 4 has a bulge 16 close to the rear end. The end of the curved portion 40 presents an acute-angled face 42 with respect to the longitudinal axis of the conductive element, and the rearward edge 44 of the face 42 projects from the element bar by a greater degree than the forward edge 43. The projection 41 has a tip end 45 that bends toward the front end of the element's axis.

The test clip of the present invention is assembled by the following procedure. First, a plurality of conductive elements 4 are arranged in the slots 12 with the curved tip 40 of each element being aligned with the jaw member 7 while the projection 41 is inserted into each of the holes 25. The first projections 17 and 18 on the outer plate 10 are inserted into the holes 30 and 31 in the inner plate 11 and the front end of the inner plate is rested on the row of steps 14, thereby causing the inner plate to be superposed on the outer plate. When the bosses 36 and 37 make snap joint with the holes 21 and 22, the rear ends of the inner and outer plates are brought into alignment to provide the support member 2 in its complete form with the conductive elements projecting from the rear end. After assembling the support member 3 in the same manner, it is combined with the support member 2, with the pin 5 being inserted through holes 19 and 20 in the first projections that are aligned with the corresponding holes 34 and 35 in the second projections. Providing the spring 6 between the spring seats 29 on the respective inner plates completes the fabrication of the test clip of the present invention. The upper portions of support members 2 and 3 are squeezed together to open the jaw members 7 and 8 against the spring pressure. As a result, the curved tips 40 of the conductive elements 4 are allowed to grip pins 10 on an IC module 9 on a circuit board P (see FIG. 5), thereby enabling output of IC pins to be picked up from the rear end of each conductive element 4. Needless to say, the most inwardly projected edge 44 provides electrical contact with the rising area of each pin 10. In this connection, a flux may remain in those portions of pins 10 which are close to the board P and this may prevent reliable electrical contact of the conductive elements to the IC pins. However, the flux generally causes greater effects on that portion of the rising area of a pin which is closer to the board P than on the bend of the pin. In accordance with the present invention, the slant face 42 at the front end of each conductive element forms an acute angle with respect to the element so that it is sufficiently pressed against the end of the pin to establish the desired electrical contact between the conductive element and pin. Thereafter, electrical output may be picked up not only from the rear ends of the conductive elements but also from the hooked projections 41. In order to pick up output from the rear ends of conductive elements, connnector receptacles (not shown) are slipped over the conductive elements until they contact the bulges 16. In this case, a probe may be connected between the bulges 16 and the rear ends of the support for the purpose of output pickup. In the embodiment shown above, it is preferred that the projections 41 do not project beyond the outside surface of the outer plate 10 so as to provide for smoother handling of the test clip with circuits, such as IC modules, that are arranged at small spacings. A lead wire hooked on the bent tip 45 of the projection 41 is passed through each of the short slots 26 without projecting beyond the outer plate and is drawn to the outside surface of the outer plate, thereby allowing a plurality of lead wires to be arranged in predetermined positions. The lead wires thus arranged are not loosely fitted in the short slots 26 but are substantially fitted rigidly therein. Therefore, the lead wires hooked on the projections serve as stoppers for preventing the wires from being disengaged not only with the bent tips 45 but also with the projections 41.

During the use of the test clip of the present invention, the pin inserted through the holes 19, 20, 34 and 35 serves not only as a fulcrum about which the supports 2 and 3 are pivoted but also as an element to constantly urge the outer plate of each support member against the inner plate. Because of this feature, the surface element of the outer plate that is in close contact with the surface element of the inner plate maintains the same contacting relation throughout the handling of the test clip and no conductive element will come loose from the support members, thereby avoiding the occurrence of a broken element 4 that may result from the loosening of the elements.

What is claimed is:

1. Circuit test clip having a pair of oppositely disposed support members pivotally connected to one another by an orthogonally crossing pin, each of said support members having a plurality of conducting elements extending longitudinally from a front to rear end of said support members, said conducting elements being juxtaposed at an interval corresponding to that of arrangement of terminals to be tested, and resilient means coacting with said support members for resiliently urging both of the front ends of the support members toward one another, the improvement wherein:

each of said support members is an assembly of an outer plate superposed on an inner plate which is shorter in length than the outer plate;

the outer plate having in the area confronting the inner plate a plurality of longitudinal slots juxtaposed at said interval for accommodating each of said conducting elements in each slot;

said outer and inner plates respectively having first and second projections extending in a direction in which one support member faces the other support member, each of said projections having holes for insertion of said pin, the inner plate having through-holes for insertion of said first projections on said outer plate;

the holes in said first projections being aligned with those in said second projections when the inner plate is superposed on the outer plate; and the positions of the first and second projections on one of said support members being complementary with those of the first and second projections on the other support member.

2. A circuit test clip according to claim 1 wherein rear ends of said conductive elements accommodated in said support members project from the rear ends thereof.

3. A circuit test clip according to claim 1 wherein each of said conductive elements is provided with an acute-angled face that is directed inwardly toward the axis of each conductive element so that said element will be pressed against the bent portion of a terminal on a circuit under test.

4. A circuit test clip according to claim 1 wherein each of said conductive elements are defined by an outwardly projecting hook portion formed in a middle portion thereof.

5. A circuit test clip according to claim 1 wherein said outer plate is provided with holes for accommodating the projections on said conductive elements, said holes being arranged in a direction traversing said slots in said middle portion of said outer plate in its longitudinal direction and communicating with said slots.

6. A circuit test clip according to claim 5 wherein an outside surface of said outer plate is provided with short slots for guiding conductor wires that communicate with said holes and are directed toward a rear end of said outer plate.

* * * * *